(12) United States Patent
Toda

(10) Patent No.: US 8,174,864 B2
(45) Date of Patent: May 8, 2012

(54) RESISTANCE-CHANGING MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 12/678,159

(22) PCT Filed: Sep. 18, 2008

(86) PCT No.: PCT/JP2008/067362
§ 371 (c)(1),
(2), (4) Date: Mar. 15, 2010

(87) PCT Pub. No.: WO2009/038220
PCT Pub. Date: Mar. 26, 2009

(65) Prior Publication Data
US 2010/0195372 A1    Aug. 5, 2010

(30) Foreign Application Priority Data
Sep. 21, 2007    (JP) .................................. 2007-244582

(51) Int. Cl.
*G11C 11/00*    (2006.01)
(52) U.S. Cl. .................................. 365/148; 365/189.09
(58) Field of Classification Search ............. 365/189.09, 365/148
See application file for complete search history.

(56) References Cited

U.S. PATENT DOCUMENTS

| 7,239,562 | B2 | 7/2007 | Takemura |
| 7,382,647 | B1* | 6/2008 | Gopalakrishnan ............ 365/163 |
| 7,623,370 | B2 | 11/2009 | Toda et al. |
| 2004/0044841 | A1 | 3/2004 | Gilton |
| 2006/0023497 | A1 | 2/2006 | Kawazoe et al. |
| 2006/0265548 | A1 | 11/2006 | Symanczyk et al. |
| 2007/0206403 | A1 | 9/2007 | Shirahama et al. |
| 2010/0091551 | A1* | 4/2010 | Hosono et al. ................ 365/148 |
| 2010/0238701 | A1* | 9/2010 | Tsukamoto et al. .......... 365/148 |

FOREIGN PATENT DOCUMENTS

| JP | 2004-185753 | 7/2004 |
| JP | 2005 537598 | 12/2005 |
| JP | 2006 66052 | 3/2006 |
| JP | 2006 331626 | 12/2006 |
| KR | 10-2004-0002697 | 1/2004 |
| KR | 10-2005-0057034 | 6/2005 |
| WO | WO 2006/137111 | 12/2006 |

OTHER PUBLICATIONS

Hosoi, Y. et al., "High Speed Unipolar Switching Resistance RAM (RRAM) Technology", IEEE International Electron Device Meeting Technical Digest, pp. 793-796, (2006).

(Continued)

*Primary Examiner* — Tuan T. Nguyen
(74) *Attorney, Agent, or Firm* — Oblon, Spivak, McClelland, Maier & Neustadt, L.L.P.

(57) ABSTRACT

A resistance-changing memory device has a cell array having memory cells, each of which stores as data a reversibly settable resistance value, a sense amplifier for reading data from a selected memory cell in the cell array, and a voltage generator circuit which generates, after having read data of the selected memory cell, a voltage pulse for convergence of a resistive state of this selected memory cell in accordance with the read data.

20 Claims, 8 Drawing Sheets

OTHER PUBLICATIONS

Korean Office Action issued Jul. 22, 2011, in Patent Application No. 10-2010-7008580 (with English-language translation).
Office Action issued Jan. 10, 2012, in Japanese Patent Application No. 2007-244582, (with English-language Translation).

Y. Hosoi, et al., "High Speed Unipolar Switching Resistance RAM (RRAM) Technology", Electron Devices Meeting 2006 Technical Digest, U.S.A. IEEE, Dec. 2006, pp. 2-5.

* cited by examiner $R = \gamma r;$
$v = V\gamma/(1+\gamma) \equiv V\eta$
$P = (V^2/r)\gamma/(1+\gamma)^2 \equiv (V^2/r)\varepsilon$

RESISTANCE-CHANGING MEMORY DEVICE

TECHNICAL FIELD

This invention relates to resistance-changing memory devices.

BACKGROUND ART

A resistance-changing memory, such as resistive random access memory (ReRAM), uses a voltage, current, heat or else to reversibly change the resistance value of a material to thereby store as information a state different in resistance value of the material, and attracts attention as one of candidates for the replacement device of flash memories. The resistance change memory is suitable for microfabrication and has its ability to configure cross-point cell arrays; furthermore, this type of memory is easy to achieve a multilayered structure of cell array.

As is known, there are two kinds of operation modes for a variable resistive element of ReRAM. One operation mode is to set a high resistive state and a low resistive state by switching the polarity of an applied voltage. This is called the bipolar type. The other operation mode is to enable setup of the high resistive state and low resistive state by controlling both a voltage value and a voltage application time period without having to switch the polarity of an applied voltage. This is known as the unipolar type (see Non-patent Document 1, for example).

To increase the density of storage data of ReRAM, it is effective to set multiple value levels of cell resistance, along with downscaling of the cell size per se. However, in view of the fact that the state of a resistive body is determined by a voltage and heat to be applied to the resistive body, the resistance value of a cell becomes readily influenceable by disturbance occurring in access events. Thus, a need is felt to provide a technique for eliminating this influenceability. In particular, the disturbance occurrable during reading by detection of a resistive state of a cell is inherently unavoidable to resistance change memories of the nondestructive read type, although such disturbance is less in magnitude. Failure to devise this countermeasure would result in degradation of the reliability of ReRAM.

[Non-patent Document 1] Y. Hosoi et al., "High Speed Unipolar Switching Resistance RAM (RRAM) Technology," IEEE International Electron Devices Meeting 2006 Technical Digest, pp. 793-796.

DISCLOSURE OF INVENTION

Technical Problem

It is therefore an object of this invention to provide a resistance change memory device with improved data reliability.

Technical Solution

In accordance with one aspect of this invention, a resistance change memory device is provided, which is characterized by including a cell array having an arrangement of memory cells each storing as data a resistance value to be set reversibly, a sense amplifier which reads the data out of a selected memory cell of the cell array, and a voltage generation circuit which generates, after having read the data of the selected memory cell, a voltage pulse for convergence of a resistive state of the selected memory cell in accordance with the data.

In accordance with another aspect of the invention, a resistance change memory device is characterized by having a memory cell array using as a memory cell a material which changes its resistive state in a way depending upon a voltage and a current or heat, a sense amplifier for reading data of a selected memory cell of the cell array, and a voltage generation circuit which generates, after having read the data out of the selected memory cell, a voltage pulse for causing a resistive state of the selected memory cell to converge in accordance with the data.

In accordance with a further aspect of the invention, a resistance change memory device includes a plurality of first and second wires crossing together, and a cell array having memory cells connected at cross points of the first and second wires, each of the memory cells being configured from a serial connection of a diode and a variable resistive element, characterized in that the ground voltage is applied to the plurality of first wires in a steady state, and, during reading of data from a selected memory cell, a voltage pulse for forcing convergence of a resistive state of the selected memory cell is given thereto after a read voltage higher than the ground voltage was given to a selected one of the first wires.

EFFECT OF THE INVENTION

According to this invention, it is possible to provide the intended resistance change memory device with improved data storage reliability.

BEST MODE FOR CARRYING OUT THE INVENTION

Figure 1:
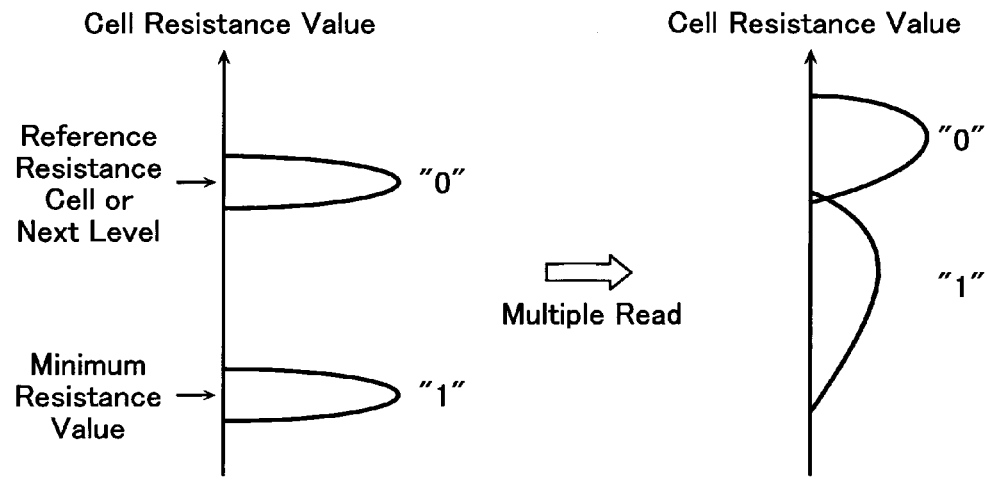
FIG. 1 is a diagram showing a change in cell resistance value distribution due to the reading of a resistance change memory.

In this invention, in view of the nature of ReRAM that the resistive state of a memory cell is easily affectable by disturbance during reading, a refresh operation is performed after a read operation, for returning the cell's resistance value to an expected value. In the refresh operation, the characteristics of a resistance-changeable material of the cell are utilized to perform an operation which forces it to reach and stay at a fixed resistance value in a self-convergent manner. This refresh operation is performed by applying a voltage pulse to a selected cell after completion of data reading, thereby setting a voltage value and pulse width time of the voltage pulse in accordance with the resistance value, at which the self-convergence is aimed.

Prior to the explanation of an embodiment for practical implementation, a detailed explanation will be given of the disturbance that occurs due to readout of ReRAM. The disturbance during read-accessing poses problems in a case which follows: a variable resistive element of a cell with its high resistive state being thermally stable experiences transition of from the high resistive state to low resistive state to be performed by voltage application (voltage process) or, alternatively, transition of from the low resistive state to high resistive state to be performed by Joule heat as produced due to the flow of an element current (heat process). In the low resistive state, no voltage is applied to the resistance-changeable material so that an increased amount of Joule heat is produced, resulting in occurrence of a specific kind of disturbance which forces the low resistive state to transit to high resistive state during reading also.

A further detailed explanation is as follows. The ReRAM cell detects a difference in current value by use of Ohm's law and performs reading of a resistive state. This cell state reading is nondestructive readout. Consequently, when reading the cell resistance, a specifically designed read voltage which is low enough to prevent or greatly suppress a change in cell state is applied to the cell, thereby detecting its state based on an electrical current derived therefrom.

In the reading session, a read voltage is applied, which is lower than a transition voltage used for transition of resistive state. Thus, the high resistive state (this state is regarded as a logic "0" for example) is maintained in such a manner that the transition to low resistive state does not occur. The heat produced at the resistive element is less. The direction of a thermally occurred change is a direction which accelerates change toward higher resistance, which is the stable state of resistance-changeable material. For these reasons, the cell state disturbance hardly takes place.

On the contrary, in the low resistive state (this state is regarded as a logic "1"), Joule heat produced is large upon application of a voltage v to the cell of interest. This can be said because $tP=tv^2/R$ is given, where t is the read time, and P is the power generated at the cell. Consequently, the resistance change material's thermal transition to its stable state is accelerated, resulting in a likewise increase in resistance value. Due to execution of a great number of readings to the same cell, this cell can become impaired in "1" data storage.

See FIG. 1, which shows such data distribution change through an increased number of read operations. Let the minimum resistance value be a "1" data bit, and let a data that is higher than this data in resistance value be a "0" (for example, the resistance value of a reference cell or, alternatively, the second resistive state in the case of multiple-value storage). Due to the great number of read operations, the data "1" of the minimum resistance value exhibits expansion of the distribution toward a higher resistance value state. Thus, there is the possibility that an overlap of "0" and "1" distribution curves occurs as shown in FIG. 1.

Especially, in the case of setting multiple value levels, it becomes vague to distinguish the minimum resistance value state from the next resistance value state or from the resistive state of a reference cell used for resistance value comparison, resulting in occurrence of a read error. Even in the case of two-value storage, the read rate can be lowered because a current difference for resistance value comparison with the reference cell becomes smaller, although no such read errors occur.

Figure 2:
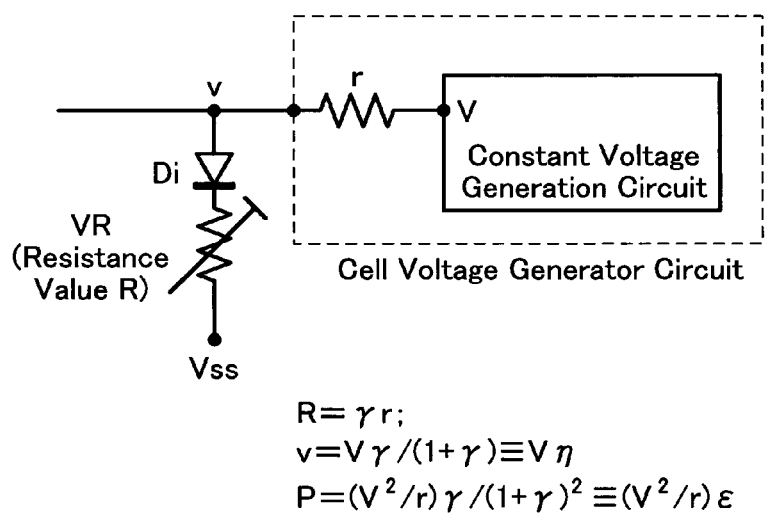
FIG. 2 is an equivalent circuit diagram for explanation of resistance dependency property of a read operation of the resistance change memory.

A relationship of power versus voltage will next be analyzed, which voltage is to be generated at the variable resistive element (resistive body) of a memory cell. As shown in FIG. 2, a cell voltage generation circuit is representable by a constant voltage V generator circuit and a series-connected resistor r up to the cell. While the memory cell is typically configured from a serial connection of a diode Di and a variable resistive element VR, consideration is taken here while ignoring the diode Di's forward voltage drop and resistance when the cell is selected.

Letting the cell's resistance value be R, a parameter γ is introduced, which indicates how many times this cell resistance value R is greater than r. Accordingly, by introducing η and ε which are functions of γ, the cell voltage v and cell power P are given by a set of equations in EQU1 below:

$$R=\gamma r,$$

$$v=V\gamma/(1+\gamma)\equiv V\eta,$$

$$P=(V^2/r)\gamma/(1+\gamma)^2\equiv(V^2/r)\epsilon. \quad [\text{EQU1}]$$

Figure 3:
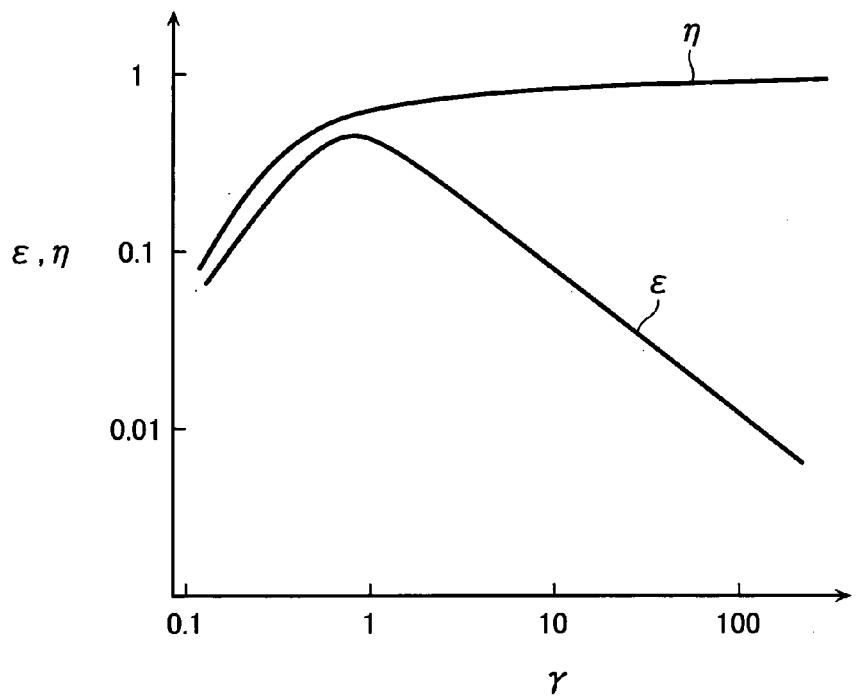
FIG. 3 is a graph for explanation of resistance dependency property of a read operation of the resistance change memory.

FIG. 3 shows, in double logarithmic graph form, the relation of η and ε versus γ. Although η increases while γ is at about one (1) or below, η becomes approximate to almost 1 and is not variable when γ becomes greater than 1. In other words, even when the cell resistance is largely changed thereafter, η is kept almost constant. On the other hand, ε has a peak at a point of γ=1 and is in almost inverse proportion to γ for ε≧1. In brief, as the cell resistance increases, ε becomes smaller at a ratio corresponding to a change ratio of such resistance value.

By applying this relationship to a read event using a read voltage V=Vread, the following is made sure. The cell voltage v is nearly equal to Vread·η. When γ is larger than 1, it is almost constant and the cell power P decreases with an increase in γ. In other words, the effect of the read cell voltage is substantially constant: it decreases when the cell resistance becomes less than r or equal thereto. Therefore, as far as the read voltage Vread is kept at a potential level whereat the cell state does not vary, the cell state is not affected in any way.

Regarding the power P, this is nearly equal to (Vread²/r)ε. P is low in the state that the cell resistance is high, and becomes maximal when the cell resistance becomes equal to r. When the cell resistance value is further lowered, P becomes less again. Thus, it can be seen that in the low resistive state with the cell resistance value being equal to r or therearound, an increased amount of heat is produced in the cell so that the "1" data cell is forced by the heat generated by the cell per se to change in its state during reading, resulting in transition to the high resistive state.

Next, consideration is given to the case of applying a voltage V which is high enough to induce transition of cell state, unlike the case of data reading. The γ dependency of η and ε is similar to that of the case of readout.

The cell voltage stays constant while $\gamma$ is 1 or greater, and decreases when $\gamma$ becomes less than or equal to 1. So, the effect of the voltage with respect to the transition of from high resistance cell state to low resistive state continues to stay constant until the resistance becomes approximately equal to r, thereby accelerating the transition of the cell resistance to low resistance. When the cell resistance becomes less than r or equal thereto, the transition is constrained.

On the contrary, the cell power increases with a decrease in $\gamma$, and again decreases thereafter while having a peak at $\gamma=1$. Accordingly, when the cell resistance value is high, there is no appreciable heat production. When the resistance value becomes equal to r or more or less, it functions to force the cell state to make a transit toward a state with a higher cell resistance value. When the cell resistance becomes less than r, the heat production becomes smaller. At this time, the cell voltage also is lowered. Consequently, the effect of the voltage that forces the cell resistance value to change toward its lower side becomes smaller. In this case also, the functionality still remains of causing the cell resistance value to transit toward higher side.

More specifically, proper setting of the value of the high voltage V makes it possible to induce the intended state transition that forces an extended cell resistance distribution to converge to r or therearound. Furthermore, by appropriate choice of the length of a time t (pulse width) for application of the high voltage V, it is possible to control heat accumulation at the cell, thereby enabling suppression or restraint of the thermally induced transition to high resistance. This makes it possible to control the $\gamma$ value, to which the resistance value is finally converged by choice of the high voltage V and its application time t. This resistance value for convergence is the value that varies toward a fixed value in a self-convergent manner, which value is determinable by the pulse voltage and the duration time thereof.

Figure 4:
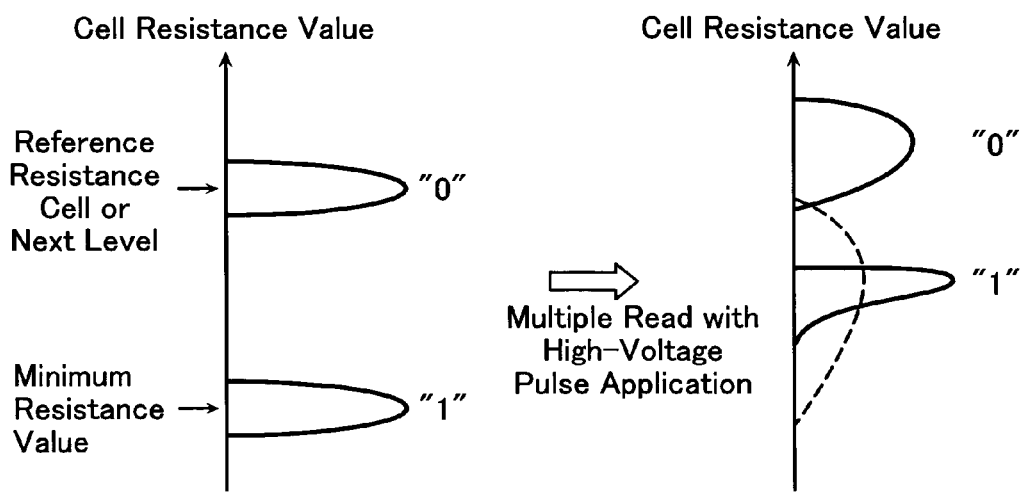
FIG. 4 is a graph showing changes in cell resistance value distribution owing to a technique of this invention in a manner in comparison with FIG. 1.

FIG. 4 shows, in a way corresponding to FIG. 1, a data distribution change due to execution of multiple read operations in the case where a high voltage pulse is applied when "1" data was read after application of the read voltage Vread. As apparent from the foregoing explanation, when Vread is applied a great number of times during cell-state reading, a change in distribution of cell resistance value becomes as shown in FIG. 1 (broken line of FIG. 4); when a pulse of the high voltage V is given in case the cell is "1," the resistance value converges to r or its nearby points so that the "1" data distribution becomes as indicated by a solid line in FIG. 4.

As stated above, when the resistive state of a cell is read out, if it is used as a memory of two-value levels, the high voltage pulse is applied to the same selected memory cell within a time period spanning from immediately after readout of such cell to the next readout only in the case of the selected memory cell's read data is "1," thereby making it possible to suppress unwanted expansion of the cell's low resistance distribution. Additionally, in the case of performing multi-value level storage also, the high voltage pulse is applied to such selected cell within a time period of from immediately after readout to the next readout upon detection of state readout of the minimum resistance value level, thereby enabling suppression of expansion of the minimum resistance value data distribution of the cell.

So far, only the minimum resistance value level was described. However, in the case of multi-value data storage, it is possible to perform the refresh operation in a similar way for other resistance value data as well as the minimum resistance value. More specifically, in view of the fact that the finally converged resistance value is controllable by adjustment of the height and/or pulse width of the high voltage pulse, it is possible to suppress expansion of each data's resistance value distribution by varying the waveform of the high voltage pulse in a way pursuant to the read data level of a cell.

More precisely, for data with higher cell resistance, the high voltage pulse is reduced in voltage value to thereby suppress the transition to low resistance or, alternatively, is lengthened in duration time to increase the amount of heat produced whereby the transition to high resistance side is accelerated so that the converged resistance value is set up.

Additionally, this high voltage pulse application should not be limited to the refresh operation after reading and may also be used for setup of cell's resistive state, i.e., writing data into a cell of multi-value levels or the like, and also for convergence of the distribution of an aimed resistance value level after having written a rough resistance value. Operations in these cases are performed typically by applying the high voltage pulse after execution of verify-reading for cell resistance value setup.

An explanation will be given below of the case of performing two-value data storage by applying a refresh-use high voltage pulse with respect to data "1," i.e., the minimum resistance value level of two-value data. Also indicated below is the case of continuously performing the refresh-use high voltage pulse application immediately after cell reading.

Figure 5:
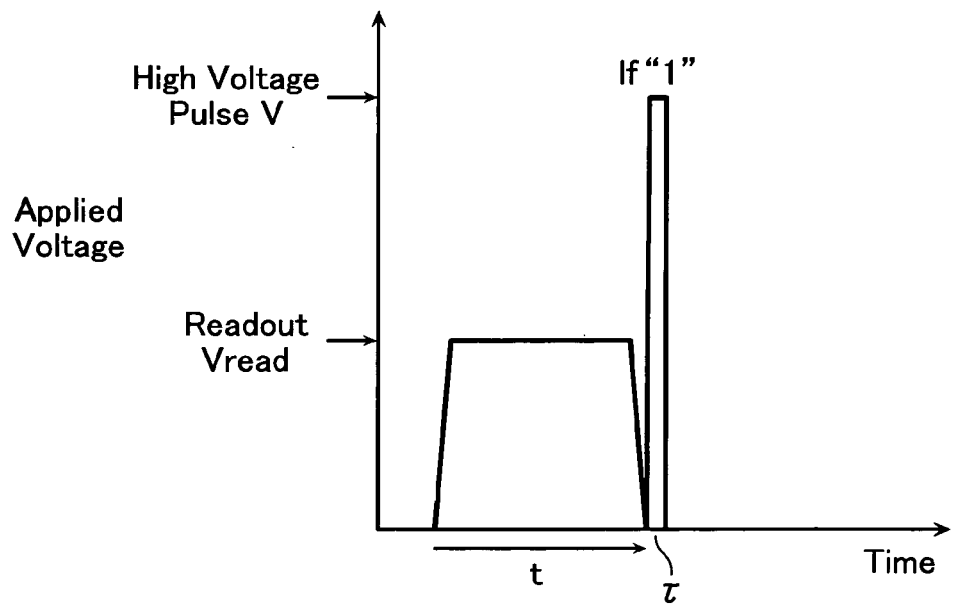
FIG. 5 is a diagram showing voltage waveforms in a read operation and its following convergence refresh operation.

FIG. 5 shows an output of a constant voltage circuit of the cell voltage generator circuit. The pulse width of cell read voltage Vread is indicated by t, and the pulse width of refresh-use high voltage V is denoted by $\tau$. The high voltage pulse V is generated when a cell state that is detected by a sense amplifier at the read pulse Vread is "1." By adjustment of this high voltage pulse V's voltage value and pulse width $\tau$, it is possible to control the heat to be produced at the cell.

Figure 6:
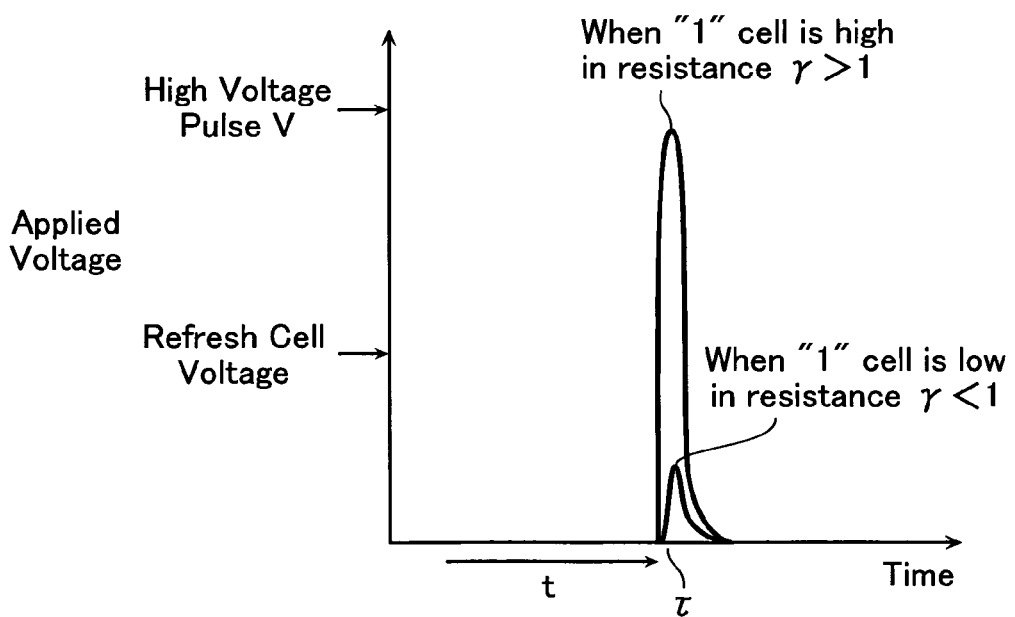
FIG. 6 is a diagram showing cell resistance dependency of a cell voltage during a refresh operation.
Figure 7:
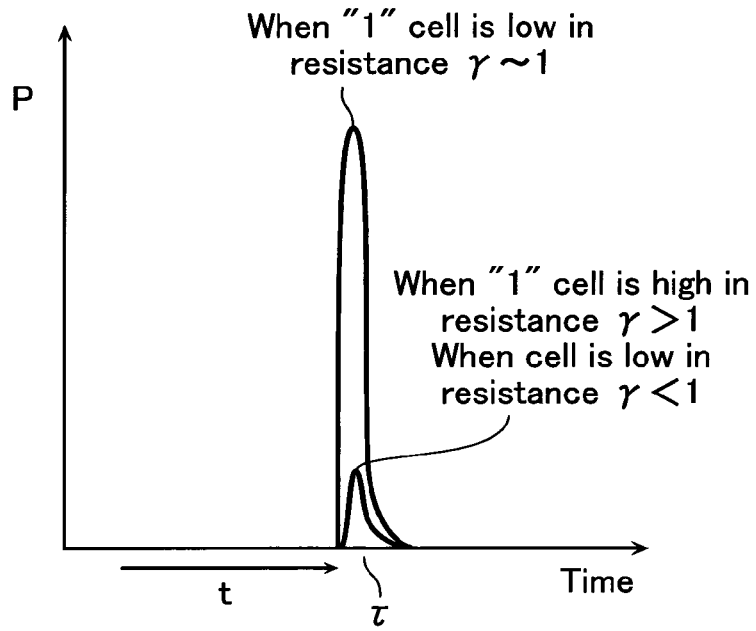
FIG. 7 is a diagram showing cell resistance dependency of cell power during the refresh operation.

FIG. 6 shows voltage waveforms of a refresh cell in the case of using the read operation voltage waveform of FIG. 5. FIG. 7 shows waveforms of power P of the refresh cell. In the voltage waveforms of FIG. 6, there are shown a waveform obtained in the case of the resistive state of "1" data cell is high relative to r ($\gamma>1$) and a waveform in case the former is lower than the latter ($\gamma<1$). As for the waveforms of the power P of FIG. 7, there are shown the case of the resistance being substantially equal to r ($\gamma\approx1$) and the case of the former being higher than the latter ($\gamma>1$) and also the case of the former being lower than the latter ($\gamma<1$).

In case the "1" data cell is of relatively high resistance, the cell voltage is high whereas the power is less; so, the high voltage pulse application results in an increase in voltage process for causing an element to transit to its low resistance side. On the other hand, power to be generated when the "1" data cell's resistive state is approximate to $\gamma=1$ is the largest; thus, the heat process for causing the element to transit to its high resistance side by application of Joule heat becomes the greatest.

As a result of the above-stated refresh operation, it becomes possible for the "1" data cell to achieve self-convergence at a low resistance value, which is determined by the voltage V and time $\tau$ of the high voltage pulse.

Figure 8:
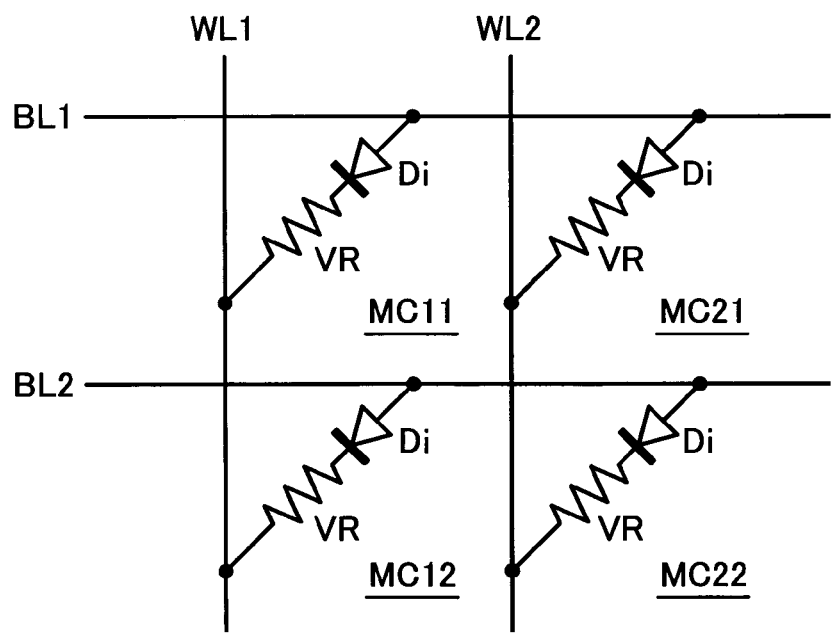
FIG. 8 is a diagram showing a cell array configuration of an embodiment.

An explanation will next be given of a practically implemented cell array configuration and its data read operation with reference to FIGS. 8 and 9. FIG. 8 shows an equivalent circuit of the cell array with respect to 2×2 bits thereof. Bit lines BL (BL1, BL2, . . . ) and word lines WL (WL1, WL2, . . . ) are arranged so that these cross together to have intersections, at which memory cells MC (MC11, MC12, . . . , MC21, MC22, . . . ) are laid out. Each memory cell has a series connection of a diode Di and a variable resistive element VR.

The variable resistive element VR of memory cell MC uses as a recording layer a certain kind of transition-metal oxide with its high resistive state as a stable state. When a prespecified potential level of setting-use voltage is given to this memory cell MC, it is possible to perform transition of from the high resistive state to low resistive state (setting operation). Alternatively, when giving to the memory cell being in its low resistive state a reset-use voltage which is lower in potential and longer in pulse width than the set-use voltage, it is possible to force the memory cell to transit to the high resistive state owing to the heat process (reset operation). By letting the high resistive state be a logic "0" storage state and letting the low resistive state be a "1" storage state, it is possible to perform two-value data storage.

Figure 9:
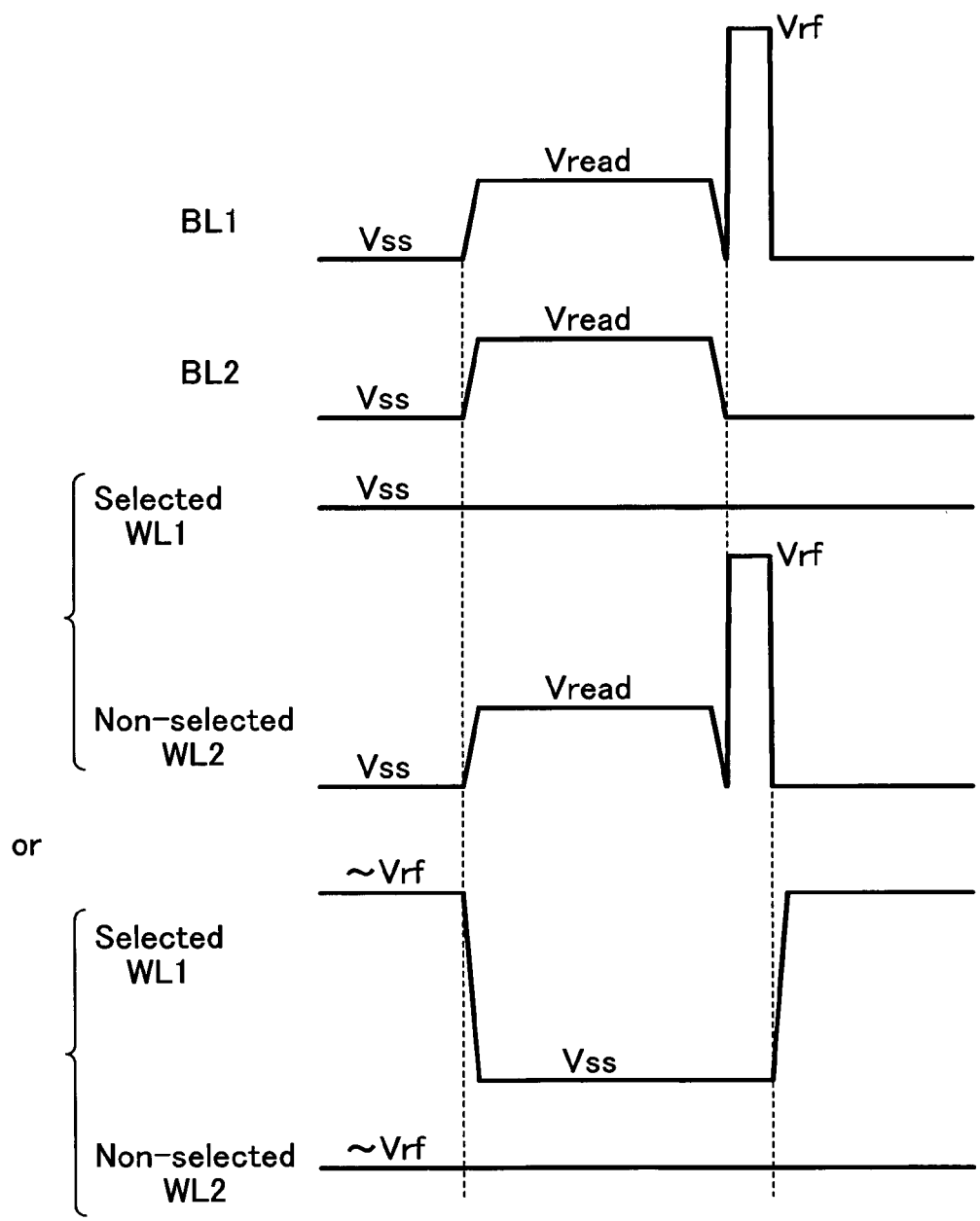
FIG. 9 is a diagram showing voltage waveforms in a read operation of the embodiment.

FIG. 9 shows read operation voltage waveforms when the word line WL1 is selected. Suppose that those memory cells (MC11 and MC12 in the range of FIG. 8) along the wordline WL1 are read simultaneously—here, it is assumed that data of memory cells MC11 and MC12 are "1" and "0," respectively.

While the selected wordline WL1 is held at Vss, a read voltage Vread is given to the bitlines BL1 and BL2. At this time, simultaneously, the read voltage Vread which becomes a blocking voltage is given to the nonselected wordline WL2 to thereby ensure that no unwanted element current flows into nonselected cells.

This makes it possible by a sense amplifier connected to the bit line BL to detect a cell current of memory cell MC11, MC12 to thereby read data therefrom. In this case, the memory cell MC11 stores data "1"; thus, after reading, a refresh-use high voltage pulse Vrf is given to its associated bitline BL1. This refresh voltage pulse is not given to the bitline BL2, at which data "0" is sensed.

For the nonselected wordline WL2, the read voltage Vread that is for use as the blocking voltage and its following refresh pulse voltage Vrf are given thereto in a way synchronized with the application of read voltage Vread and refresh voltage pulse Vrf to the bitline BL1.

Alternatively, the selected wordline WL1 is set at Vss during reading while letting a high voltage with its potential of about Vrf be initially given to the wordline.

In this way, in the case of the read cell storing data "1," the refresh-use high voltage is applied to this cell whereby it becomes possible to achieve the data reliability after execution of a great number of read operations.

Figure 10:
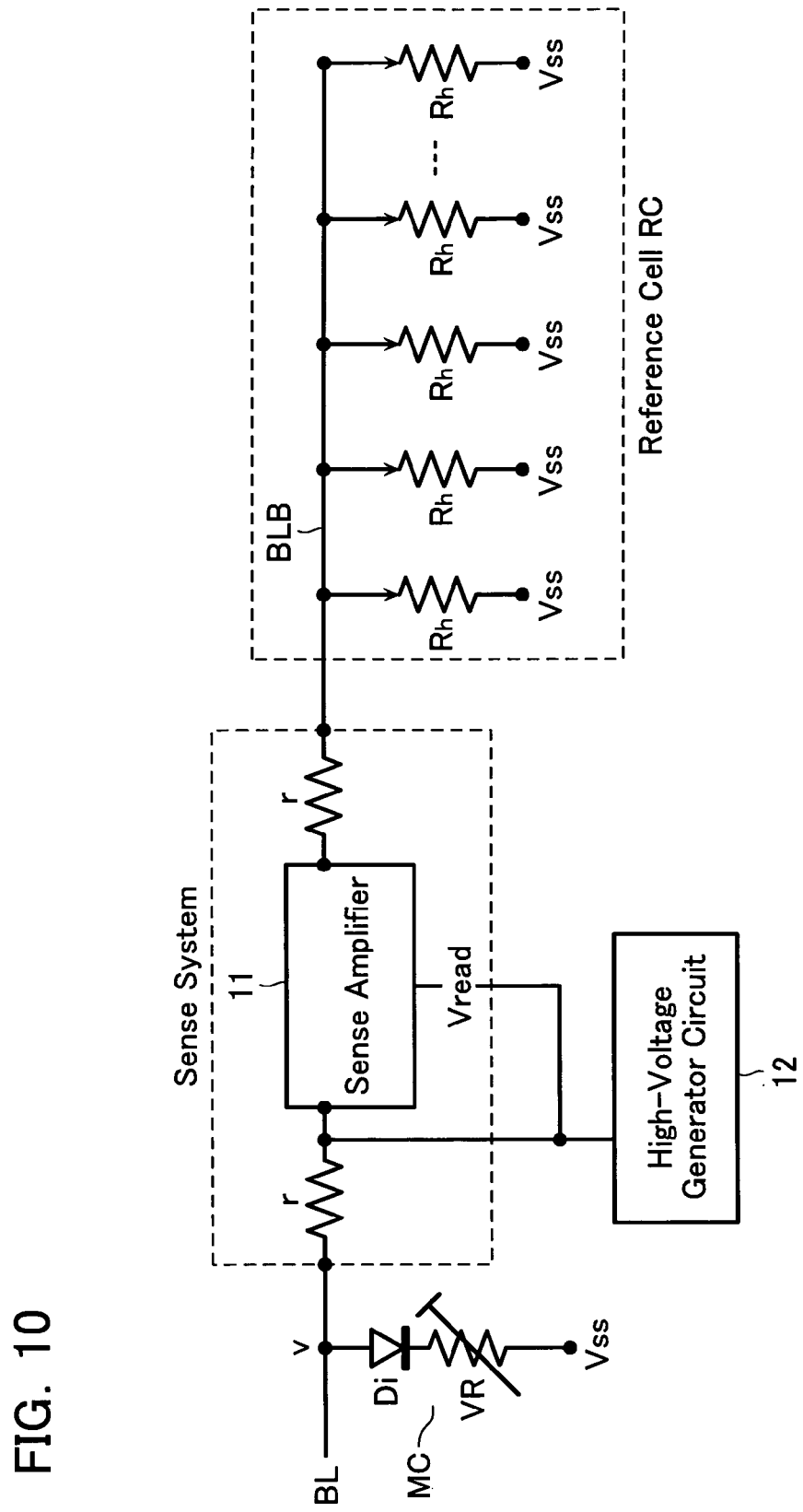
FIG. 10 is a diagram showing a configuration of sense system of the embodiment.

FIG. 10 shows a data sense system which is connected to a bit line BL. A sense amplifier 11 is a differential amplifier having one input node connected to the bitline BL and the other input node connected to a reference bitline BLB, to which a reference cell RC is coupled. The sense system includes a resistor r of from a cell MC up to the reference cell RC.

A high voltage generation circuit 12 generates, during reading, a read voltage Vread which is given via the resistor r to the cell MC and the reference cell RC. During convergence refreshing, it generates a high voltage pulse to be given to a selected cell MC through the resistor r.

The reference cell RC is configured from a parallel connection of a plurality of high resistive state cells (variable resistive elements Rh) to reduce the resistance, thereby obtaining a reference cell current. The use of such high resistive state cells achieves enhanced stability against cell state transition occurring due to application of the read voltage Vread. For the reference cell RC, there is no need to perform convergence refreshing.

Figure 11:
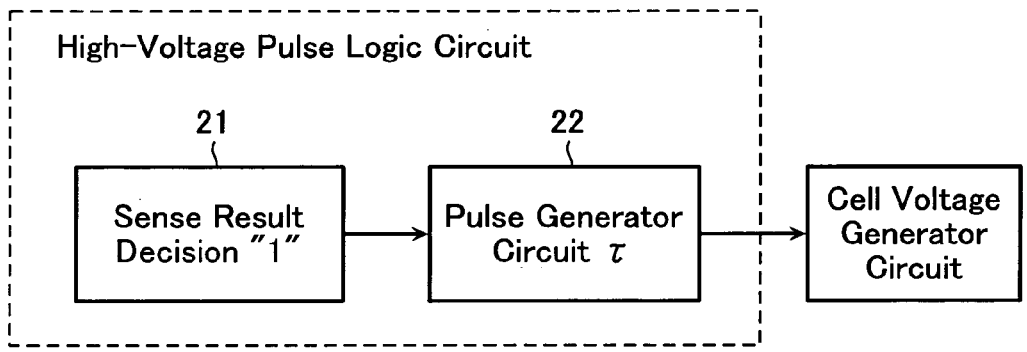
FIG. 11 is a diagram showing a high voltage pulse generation logic circuit used for convergence refreshing.
Figure 12:
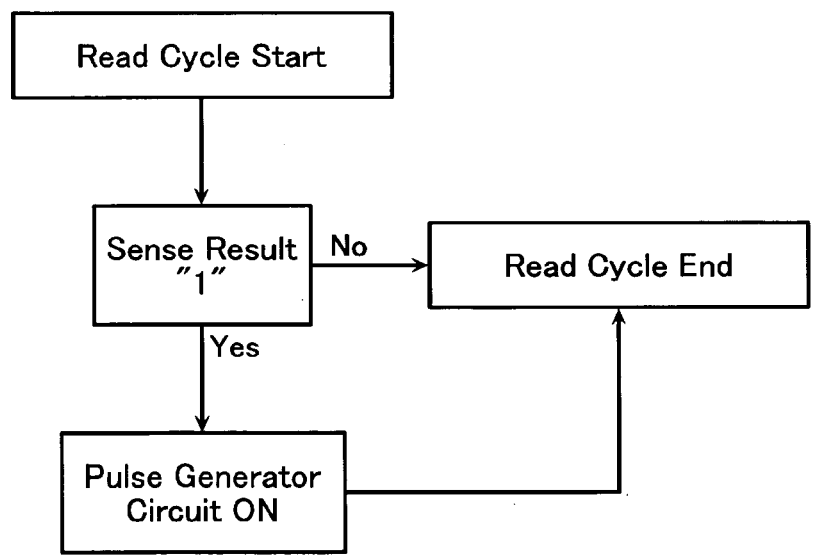
FIG. 12 is a diagram showing a logic flow of the logic circuit.

FIG. 11 shows a logic circuit for generation of the refresh-use high voltage. FIG. 12 shows a logic flow thereof. The high voltage pulse logic circuit has a sense result decision circuit 21 and a pulse generation circuit 22 which is responsive to receipt of a decision result of the circuit 21 for generating a pulse(s). The sense result decision circuit 21 determines whether the cell's resistive state is in the state for performing the convergence refreshing (i.e., data "1") or not. The pulse generator circuit 22 generates a pulse with a pulse width $\tau$ for execution of the convergence refreshing. An output of this high-voltage pulse logic is used to drive a cell voltage generator circuit 23 so that a high voltage pulse with its voltage V and width $\tau$ is generated.

The logic flow is such that after startup of a read cycle, if a cell state detection result is decided by the sense amplifier to be "1" then the pulse generator circuit is turned on, followed by termination of the read cycle. If the sense result is not "1," the read cycle is terminated immediately.

Figure 13:
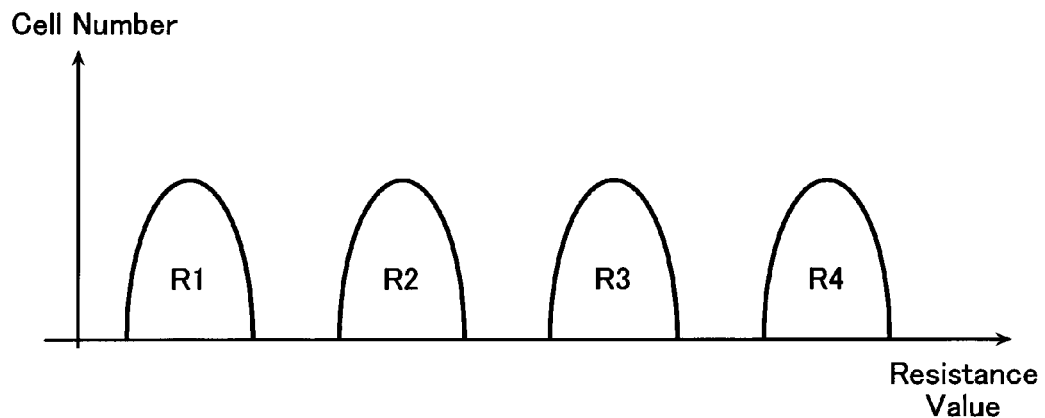
FIG. 13 is a diagram showing a data distribution in the case of four-value data storage.

FIG. 13 shows a data distribution in the case of four-value data storage using four resistance values R1, R2, R3 and R4 as one example of the multi-value data storage. For example, suppose that the state of the largest resistance value R4 is in a thermally stable state, and the state of any one of resistance values R1-R3 is set from this state by a voltage process. Also suppose that the state of each of these resistance values R1-R3 is reset by a heat process to the maximum resistance value R4.

Figure 14:
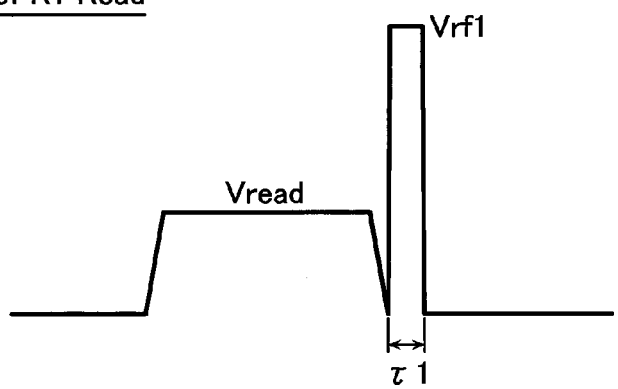
FIG. 14 is a diagram showing read operation voltage waveforms of resistive states R1 and R2 of four-value data.
Figure 14:
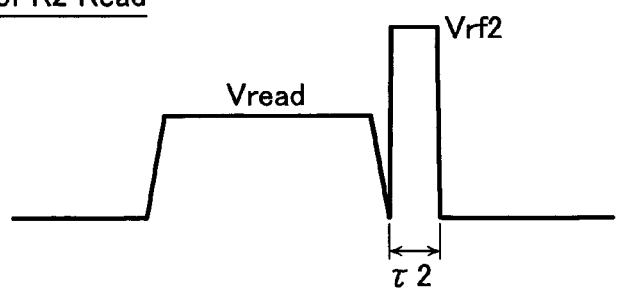

Assuming here that the states of the lowest resistance value R1 and the next low resistance value R2 are large in resistance value shift due to application of a voltage at the time of data readout and that a refresh operation is performed when these data states are read out, FIG. 14 shows exemplary voltage waveforms during read operations of the data states R1 and R2.

More specifically, during reading of the resistance value state R1, a refresh-use high voltage Vrf1 with its pulse width $\tau 1$ is applied after application of the read voltage Vread. When reading the resistive state R2, a refresh-use high voltage Vrf2 with its pulse width $\tau 2$ is applied after application of the read voltage Vread. Here, let $\tau 1 < \tau 2$ and $Vrf2 < Vrf1$, for example. This provides a specific condition which ensures that the resistance value R1 is returned to the lower resistance side more readily than the resistance value R2 in the refresh operation under an assumption that the resistance value R1 is greater than resistance value R2 in shift toward high resistance side due to readout.

It should be noted that it is not always necessary to satisfy the refresh operation conditions of $\tau 1 < \tau 2$ and $Vrf2 < Vrf1$ simultaneously. For example, a condition of $\tau 1 < \tau 2$ and $Vrf1 = Vrf2$ may be employed; alternatively, a condition of $\tau 1 = \tau 2$ and $Vrf2 < Vrf1$ is settable. Obviously, the refresh operation may be performed under appropriate conditions during reading of the resistance value R3 also.

This invention should not exclusively be limited to the storage of four-value data and may also be applied to the storage of multi-value data of more than three values in a similar way.

Furthermore, although the countermeasure against disturbance in normal data read operations was explained so far, in the case of performing the multi-value data setup by means of repeated execution of a setting operation (write operation) and its following verify-read operation as an example, it is effective to add the refresh operation with respect to such verify-read operation.

Several features of the resistance change memory incorporating the principles of this invention are summarized as follows.

In the resistance change memory which uses for data storage a material that is variable in its resistive state due to a voltage, current or heat, the material with its thermally stable state being high in resistance is used so that at least two values of high and low resistive states are utilized as data states while applying, after having read a memory cell of the low resistive state, a voltage pulse to the read cell, which voltage is higher in potential than the voltage that was used for readout.

In the resistance change memory which uses for data storage a material that is variable in resistive state due to a voltage, current or heat, a plurality of resistance value levels are set up for storing data in a memory cell as a resistance value, wherein after data readout, a voltage pulse is given to such read cell in accordance with the resulting resistive state thus read, thereby performing a refresh operation for convergence of such resistive state.

In the resistance change memory which uses for data storage a material that is variable in resistive state due to a voltage, current or heat, a material with its thermally stable resistive state being high in resistance is used while letting a resistive state toward high resistive state and low resistive state be divided into a plurality of zones for utilizing a corresponding zone as multiple-value level, wherein a high voltage pulse is applied to a read cell after data readout, which voltage is higher in potential than the voltage that was used for readout and which becomes lower in voltage value as a resistance value thus read is higher.

In the resistance change memory which uses for data storage a material that is variable in resistive state due to a voltage, current or heat, a material with its thermally stable resistive state being high in resistance is used while letting a resistive state toward high resistive state and low resistive state be divided into a plurality of zones for utilizing a corresponding zone as multi-value level, wherein a high voltage pulse is applied to a cell after data readout, which voltage is higher in potential than the voltage that was used for readout and which becomes longer in pulse application time period as a resistance value thus read becomes higher.

In the resistance change memory which uses for data storage a material that is variable in resistive state due to a voltage, current or heat, a material with its thermally stable resistive state being high in resistance is used while letting a resistive state toward high resistive state and low resistive state be divided into a plurality of zones for utilizing a corresponding zone as multi-value level, wherein upon setup of multi-value level states, after execution of verify-read of the settings of resistance values corresponding to respective zones, a high voltage pulse is applied to a cell to thereby force its resistance value to converge and fall within the setup zone, which voltage is higher in potential than the voltage that was used for such verify-read and which becomes lower in voltage value and longer in pulse application time as a read resistance value becomes larger.

The invention claimed is:

1. A resistance-changing memory device, comprising:
a cell array having an arrangement of memory cells each storing as data a resistance value to be set reversibly;
a sense amplifier operative to read the data out of a selected memory cell of said cell array; and
a voltage generation circuit operative to generate, after having read the data of said selected memory cell, a voltage pulse for convergence of a resistive state of said selected memory cell in accordance with the data.

2. The resistance-changing memory device according to claim 1, wherein
said memory cells performs storage of two-value data having a high resistive state and a low resistive state with the high resistive state being as a stable state, and
said voltage generation circuit is arranged to generate, when data readout results in said selected memory cell being in the low resistive state, a voltage pulse higher than a read voltage to be given to said selected memory cell during data reading.

3. The resistance-changing memory device according to claim 1, wherein
said memory cell performs storage of multiple-value data as defined by at least three resistance values with a maximal resistance value state being as a stable state, and
said voltage generation circuit is arranged to generate, when data readout results in said selected memory cell being in a resistance value state being less than or equal to a predetermined value, a voltage pulse which is higher than a read voltage to be given to said selected memory cell during data reading and which becomes lower as a read resistance value becomes higher.

4. The resistance-changing memory device according to claim 1, wherein
said memory cell performs storage of multiple-value data as defined by at least three resistance values with a maximal resistance value state being as a stable state, and
said voltage generation circuit is arranged to generate, when data readout results in said selected memory cell being in a resistance value state less than or equal to a predetermined value, a voltage pulse which is higher than a read voltage to be given to said selected memory cell during data reading and which becomes larger in pulse width as a read resistance value becomes higher.

5. The resistance-changing memory device according to claim 1, wherein
said memory cell performs storage of multiple-value data as defined by at least three resistance values with a maximal resistance value state being as a stable state, and
said voltage generation circuit is arranged to generate, when data readout results in said selected memory cell being in a resistance value state less than or equal to a predetermined value, a voltage pulse which is higher than a read voltage to be given to said selected memory cell during data reading and which becomes lower in potential and larger in pulse width as a read resistance value becomes higher.

6. The resistance-changing memory device according to claim 1, further comprising a reference cell for use as a reference for decision of the resistive state of the memory cell,
wherein said sense amplifier is a differential amplifier having a one node for permitting inflow and outflow of an electrical current flowing in said memory cell and a remaining node for permitting inflow and outflow of a current flowing in said reference memory cell.

7. The resistance-changing memory device according to claim 3, wherein said operation of reading data out of said selected memory cell is a verify-read operation after an operation of writing data into said selected memory cell.

8. A resistance-changing memory device, comprising:
a memory cell array using as a memory cell a material which changes its resistive state in dependence upon a voltage and a current or heat;
a sense amplifier operative to read data of a selected memory cell of said cell array; and a voltage generation circuit operative to generate, after having read the data out of said selected memory cell, a voltage pulse for causing a resistive state of said selected memory cell to converge in accordance with the data.

9. The resistance-changing memory device according to claim 8, wherein said memory cell uses a material with a thermally stable resistive state being high in resistance to utilize as data states at least two values of a high resistive state and a low resistive state, and said voltage generation circuit applies to said memory cell thus read a voltage pulse higher than a voltage used for data readout after having read said memory cell being in the low resistive state.

10. The resistance-changing memory device according to claim 8, wherein said memory cell sets a plurality of resistance value levels and stores data as a resistance value, and said voltage generation circuit performs a refresh operation for giving the voltage pulse to said memory cell thus read to thereby cause its resistive state to converge in a way depending on a resistive state as read after data reading.

11. The resistance-changing memory device according to claim 8, wherein said memory cell uses a material with its thermally stable resistive state being high in resistance to utilize as multiple-value levels a plurality of zones divided from a resistive state toward the high resistive state and the low resistive state, and said voltage generation circuit applies to said memory cell thus read after data reading a high voltage pulse which is higher than a voltage used for reading and which becomes lower in voltage value as a read resistance value becomes higher.

12. The resistance-changing memory device according to claim 8, wherein said memory cell uses a material with its thermally stable resistive state being high in resistance to utilize as multiple resistance value levels a plurality of zones divided from a resistive state toward the high resistive state and the low resistive state, and said voltage generation circuit applies to said memory cell after data readout a voltage pulse which is higher than a voltage used for readout and which becomes longer in pulse application time as a read resistance value becomes higher.

13. The resistance-changing memory device according to claim 8, wherein said memory cell uses a material with its thermally stable resistive state being high in resistance to utilize as multiple resistance value levels a plurality of zones divided from a resistive state toward the high resistive state and the low resistive state, and that upon setup of multiple-value levels, after completion of verify-read of the setup to a resistance value corresponding to each zone, said voltage generation circuit applies to said memory cell a voltage pulse which is higher than a voltage used for the verify-read and which becomes lower in voltage value and longer in pulse application time as a read resistance value becomes higher to thereby cause the resistance value to converge into the set zone.

14. A resistance-changing memory device comprising a plurality of first and second wires crossing together, and a cell array having memory cells connected at cross points of the first and second wires, each said memory cells being configured from a serial connection of a diode and a variable resistive element, wherein a ground voltage is applied to the plurality of first wires in a steady state, and during a reading of data from a selected memory cell, a voltage pulse for forcing convergence of a resistive state of the selected memory cell is given thereto after a read voltage higher than the ground voltage was given to a selected one of the first wires.

15. The resistance-changing memory device according to claim 14, wherein the ground voltage is applied to the plurality of the second wires in the steady state, and that a voltage which is the same as a voltage applied to the selected first wire is applied to non-selected ones of the second wires in an event for reading data from said selected memory cell.

16. The resistance-changing memory device according to claim 14, wherein a voltage being the same in potential level as said voltage pulse is applied to said second wires in the steady state, and that the ground voltage is applied to a selected one of said second wires in an event for reading data from said selected memory cell.

17. The resistance-changing memory device according to claim 14, wherein said memory cell performs storage of two-value data having a high resistive state and a low resistive state with the high resistive state being as a stable state, and said voltage pulse is higher then a read voltage when data readout results in said selected memory cell being in the low resistive state.

18. The resistance-changing memory device according to claim 14, wherein said memory cell stores therein multiple value data as defined by at least three resistance values while letting a maximal resistance value state be a stable state, and when data readout results in said selected memory cell being in a resistance value state being less than or equal to a prespecified value, said voltage pulse is higher than a read voltage and becomes lower as a read resistance value becomes higher.

19. The resistance-changing memory device according to claim 14, wherein said memory cell stores therein multiple value data as defined by at least three resistance values while letting a maximal resistance value state be a stable state, and when data readout results in said selected memory cell being in a resistance value state less than or equal to a prespecified value, said voltage pulse is higher than a read voltage and becomes greater in pulse width as a read resistance value becomes higher.

20. The resistance-changing memory device according to claim 14, wherein said memory cell stores therein multiple value data as defined by at least three resistance values while letting a maximal resistive state be a stable state, and when data readout results in said selected memory cell being in a resistance value state less than or equal to a prespecified value, said voltage pulse is higher than a read voltage to be given to said selected memory cell during reading and becomes larger in pulse width as a read resistance value becomes higher.

* * * * *